(12) United States Patent
Kim et al.

(10) Patent No.: US 11,846,019 B2
(45) Date of Patent: Dec. 19, 2023

(54) ONE-BODY SHADOW FRAME SUPPORT WITH FLOW CONTROLLER

(71) Applicant: Applied Materials, Inc., Santa Clara, CA (US)

(72) Inventors: Jong Yun Kim, Hwaseong-si (KR); William Nehrer, Soquel, CA (US); Jungwon Park, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 152 days.

(21) Appl. No.: 17/491,778

(22) Filed: Oct. 1, 2021

(65) Prior Publication Data
US 2023/0106522 A1 Apr. 6, 2023

(51) Int. Cl.
*C23C 16/44* (2006.01)
*C23C 16/52* (2006.01)

(52) U.S. Cl.
CPC .......... *C23C 16/4405* (2013.01); *C23C 16/52* (2013.01)

(58) Field of Classification Search
CPC . C23C 16/52; C23C 16/4401; C23C 16/4405; C23C 16/45502; C23C 16/45589; C23C 16/4585
See application file for complete search history.

(56) References Cited

U.S. PATENT DOCUMENTS

| | | | |
|---|---|---|---|
| 6,328,808 B1 | 12/2001 | Tsai et al. | |
| 9,708,709 B2 | 7/2017 | Ohashi et al. | |
| 10,763,138 B2 | 9/2020 | Kim | |
| 2009/0064934 A1 | 3/2009 | Park et al. | |
| 2018/0202045 A1* | 7/2018 | Ji | C23C 16/507 |

FOREIGN PATENT DOCUMENTS

| | | |
|---|---|---|
| JP | 2007-194361 A | 8/2007 |
| WO | 2015-023435 A1 | 2/2015 |

OTHER PUBLICATIONS

Search Report dated Dec. 22, 2022 for Application No. PCT/US2022/042599.

* cited by examiner

*Primary Examiner* — Joseph A Miller, Jr.
(74) *Attorney, Agent, or Firm* — PATTERSON + SHERIDAN, LLP

(57) ABSTRACT

Embodiments of the present disclosure relate to a shadow frame support with one or more flow controllers and a method of controlling the flow of gases through the shadow frame support. The shadow frame support includes a body coupled to walls of a chamber such that a top surface of the shadow frame support is horizontally disposed in the chamber. The body has a plurality of channels disposed therethrough. Each channel includes a flow controller. The flow controller may be adjusted in real-time to change the open ratio of the flow controller.

12 Claims, 7 Drawing Sheets

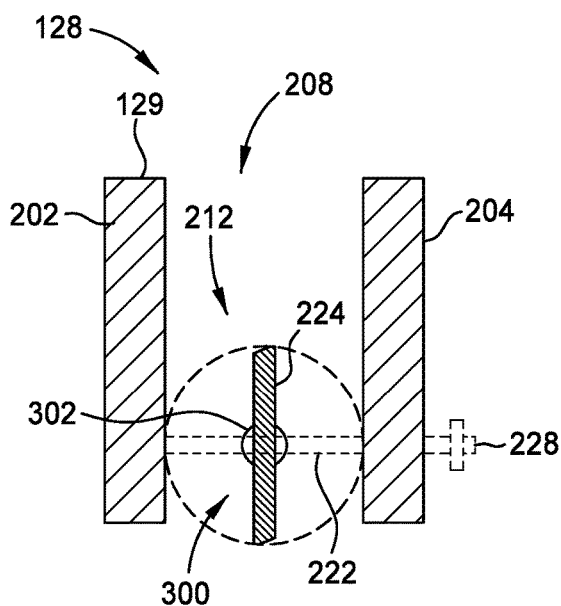 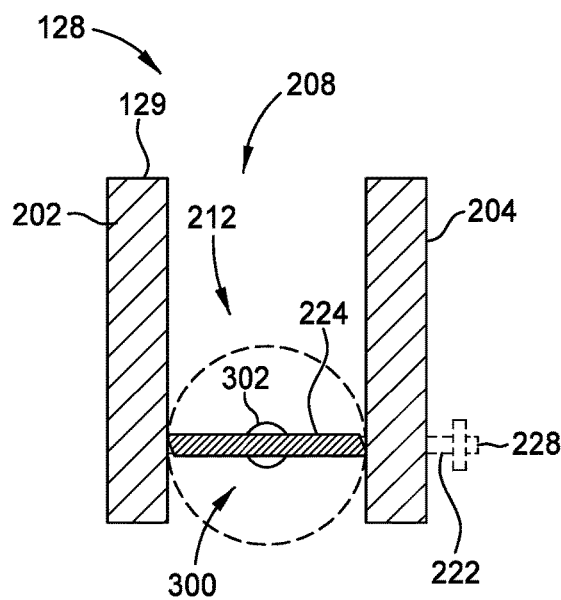
FIG. 3A  FIG. 3B
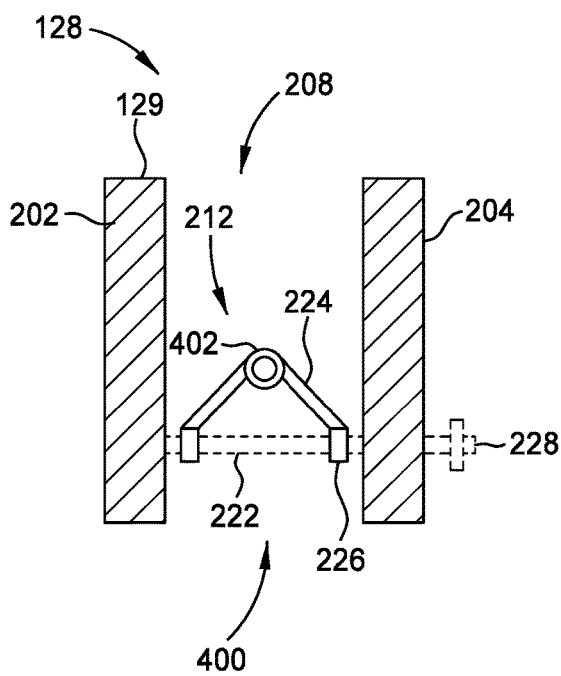 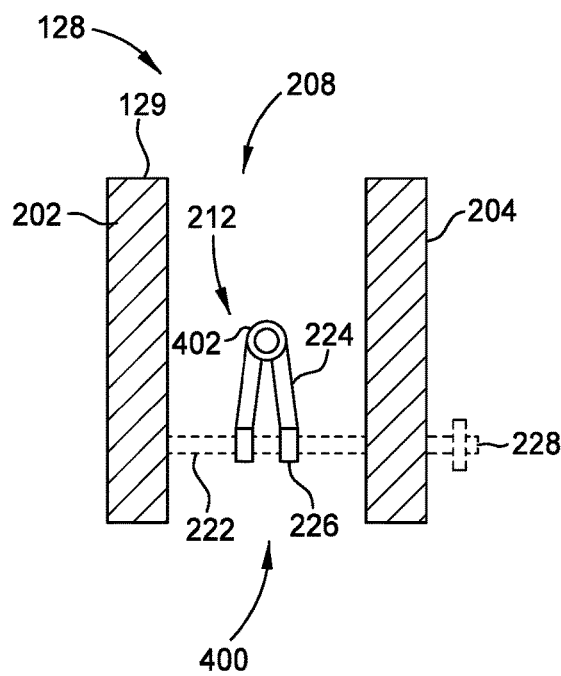
FIG. 4A  FIG. 4B ated to US 11,846,019 B2

ONE-BODY SHADOW FRAME SUPPORT WITH FLOW CONTROLLER

BACKGROUND

Field

Embodiments of the present disclosure generally relate to a process chamber and a cleaning method. More specifically, embodiments described herein provide for a shadow frame support with one or more flow controllers and a method of controlling the flow of gases through the shadow frame support.

Description of the Related Art

Substrate processing chambers provide a wide variety of functions. Often, when depositing dielectric layers on the substrate, the residue from the deposition process collects on the walls and other surfaces of the process chambers. These deposits may become friable and contaminate the surface of the substrate.

Currently, the mechanisms for removing silicon or carbon containing deposits from the surfaces of the chamber include remote plasma cleaning, in situ RF plasma cleaning, or RF-assisted remote plasma cleaning. Remote plasma with a cleaning gas may be used for cleaning the chamber surfaces. For example, a cleaning gas may be remotely ignited into a plasma and the radicals from the plasma are introduced into the chamber to etch away film deposited on the chamber surfaces. The cleaning gas may flow through a shadow frame support disposed in the chamber, resulting in uneven cleaning in the chamber. Accordingly, what is needed in the art is an improved shadow frame support.

SUMMARY

In one embodiment, a shadow frame support is provided. The shadow frame support includes a body with an interior opening. The shadow frame support further includes a plurality of channels disposed through the body and a flow controller disposed in each of the plurality of channels. The flow controller includes a flow blocker in communication with an adjustment actuator. The adjustment actuator is operable to adjust each flow blocker within each of the plurality of channels to adjust an open ratio of each flow controller.

In another embodiment, a process chamber is provided. The process chamber includes a chamber body having an interior defined by a plurality of walls. The process chamber further includes a substrate support disposed in the chamber body and a diffuser disposed above the substrate support within the chamber body. The process chamber further includes a shadow frame support disposed inside the chamber body. The shadow frame support includes a body. Each outer surface of the body is coupled to an interior surface of the plurality of walls. The shadow frame support further includes a plurality of channels disposed through the body and a flow controller disposed in each of the plurality of channels.

In yet another embodiment, a cleaning method is provided. The cleaning method includes raising a substrate support to a cleaning position in a process chamber to contact a shadow frame. The shadow frame is disposed on a shadow frame support within a process chamber and includes a plurality of channels disposed therethrough. Each channel of the plurality of channels includes a flow controller. The method further includes flowing a cleaning gas within the process chamber. The cleaning gas flows through the plurality of channels in the shadow frame support. The method further includes adjusting an open ratio of each flow controller within the plurality of channels.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A and 3B are schematic, cross-sectional views of a first configuration of a flow controller according to embodiments described herein.

FIGS. 4A and 4B are schematic, cross-sectional views of a second configuration of a flow controller according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to a process chamber and a cleaning method. More specifically, embodiments described herein provide for a shadow frame support with one or more flow controllers and a method of controlling the flow of gases through the shadow frame support.

In one embodiment, a process chamber is provided. The process chamber includes a chamber body having an interior defined by a plurality of walls. The process chamber further includes a substrate support disposed in the chamber body and a diffuser disposed above the substrate support within the chamber body. The process chamber further includes a shadow frame support disposed inside the chamber body.

The shadow frame support includes a body. Each outer surface of the body is coupled to an interior surface of the plurality of walls. The shadow frame support further includes a plurality of channels disposed through the body and a flow controller disposed in each of the plurality of channels. Each flow controller is coupled to an adjustment actuator disposed through the plurality of walls and the shadow frame support. The process chamber may further include a controller in communication with the adjustment actuator of each flow controller.

In another embodiment, a cleaning method is provided. The cleaning method includes raising a substrate support to a cleaning position in a process chamber to contact a shadow frame. The shadow frame is disposed on a shadow frame support within a process chamber and includes a plurality of channels disposed therethrough. Each channel of the plurality of channels includes a flow controller. The method further includes flowing a cleaning gas within the process chamber. The cleaning gas flows through the plurality of channels in the shadow frame support. The method further includes adjusting an open ratio of each flow controller within the plurality of channels.

Figure 1:
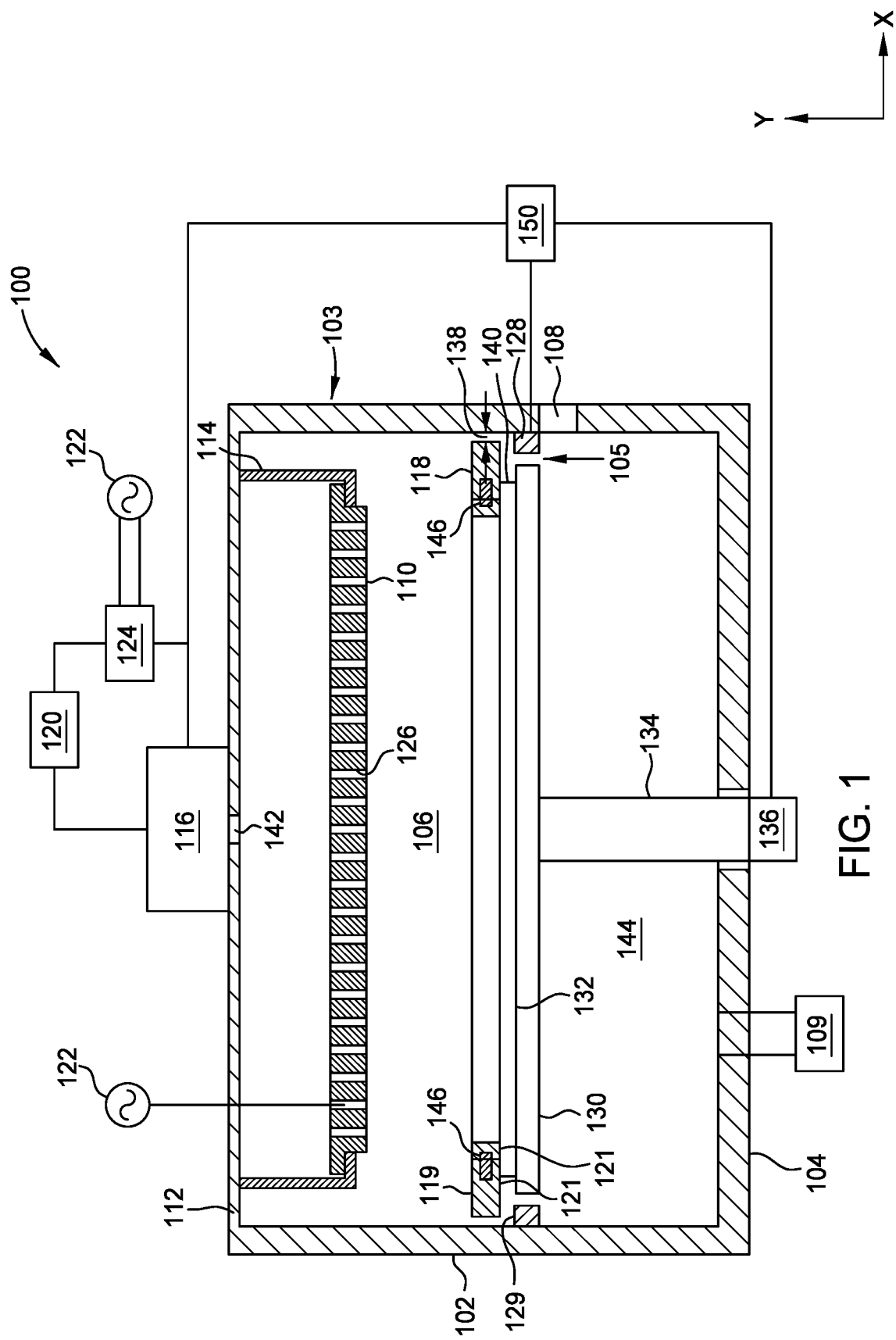
FIG. 1 is a cross sectional view of a chamber according to embodiments described herein.

FIG. 1 is a cross sectional view of a chamber 100. It is to be understood that the chamber 100 described below is an exemplary chamber and other process chambers may be used with or modified to include a shadow frame support in accordance with the embodiments of the disclosure.

The chamber 100 generally includes walls 102, a bottom 104, a diffuser 110, and substrate support 130. The walls 102, the bottom 104, the diffuser 110, and the substrate support 130 define a process volume 106. The process volume 106 is accessed through an opening 108 such as a slit valve. The opening 108 is positioned through the wall 102 of the chamber 100 such that the substrate 140 may be transferred in and out of the chamber 100. A chamber body 103 includes an interior of the chamber 100 defined by the walls 102, the bottom 104, and a backing plate 112. The substrate support 130 includes a substrate receiving surface 132 for supporting the substrate 140. A stem 134 may be coupled to a lift system 136 to raise and lower the substrate support 130. A vacuum pump 109 may be coupled to the chamber 100 to control the process volume 106 at a desired pressure. For example, the process volume 106 is maintained at a vacuum pressure.

The chamber 100 includes a diffuser 110. In one example, the diffuser 110 is coupled to the backing plate 112 at a periphery of the backing plate 112 with a suspension 114. In another example, which can be combined with other embodiments described herein, the diffuser 110 may also be coupled to the backing plate 112 by one or more coupling supports. A gas manifold 116 is coupled to the backing plate 112. The gas manifold 116 is operable to facilitate the introduction of gases into the process volume 106. A gas source 120 may be coupled to the gas manifold 116 to provide gas, such as a processing gas, through a gas outlet 142 in the backing plate 112 and through gas passages 126 in the diffuser 110 to the substrate receiving surface 132. The gas source 120 may supply one or more of a processing gas or a cleaning gas. Examples of the processing gases include, but are not limited to, silane ($SiH_4$), ammonia ($NH_3$), nitrous gas ($N_2O$), nitrogen gas ($N_3$), hydrogen gas ($H_2$), argon gas ($Ar_2$), phosphine ($PH_3$), diborane ($B_2H_6$), and combinations thereof. Examples of the cleaning gas include but are not limited to, nitrogen fluoride ($NF_3$), fluorine ($F_2$), sulfur fluoride ($SF_6$), carbon fluoride ($C_2F_6$), hydrochloric acid (HCl), and combinations thereof.

An RF power source 122 is coupled to the diffuser 110 to provide an RF power to the diffuser 110. The RF power creates an electric field between the diffuser 110 and the substrate support 130 so that a plasma may be generated from the gases between the diffuser 110 and the substrate support 130. Various frequencies may be used, such as a frequency between about 0.3 MHz and about 200 MHz. In one embodiment, the RF power source 122 is provided at a frequency of 13.56 MHz.

A remote plasma source 124, such as an inductively coupled remote plasma source, may also be coupled to the gas manifold 116. The remote plasma source 124 may be disposed between the gas source 120 and the gas manifold 116. Between processing substrates with the processing gas, a cleaning gas from the gas source 120 may be provided to the remote plasma source 124 so that a remote plasma is generated and provided to the chamber 100 to clean chamber components. The cleaning gas may be further excited by the RF power source 122 coupled to the remote plasma source 124.

During processing, a shadow frame 118 may be placed over the periphery of the substrate 140. The chamber 100 further includes a shadow frame support 128. The shadow frame support 128 is coupled to the walls 102 of the chamber 100 and is disposed in the chamber body 103. When the substrate 140 is initially inserted into the chamber, the shadow frame 118 may rest on a top surface 129 of the shadow frame support 128. An upper surface 119 of the shadow frame 118 is parallel with the top surface 129 of the shadow frame support 128 when the shadow frame 118 is disposed on the shadow frame support 128. When the substrate support 130 raises to the processing position, as shown in FIG. 1, the shadow frame 118 may be raised by the substrate 140 and substrate support 130 off of the shadow frame support 128. Upon completion of processing of the substrate 140, the substrate support 130 is lowered and the substrate 140 is removed from the chamber 100. The shadow frame support 128 includes an interior opening 105. The substrate receiving surface 132 is operable to pass through the interior opening 105 to lift the shadow frame 118 into the processing position.

Figure 6A:
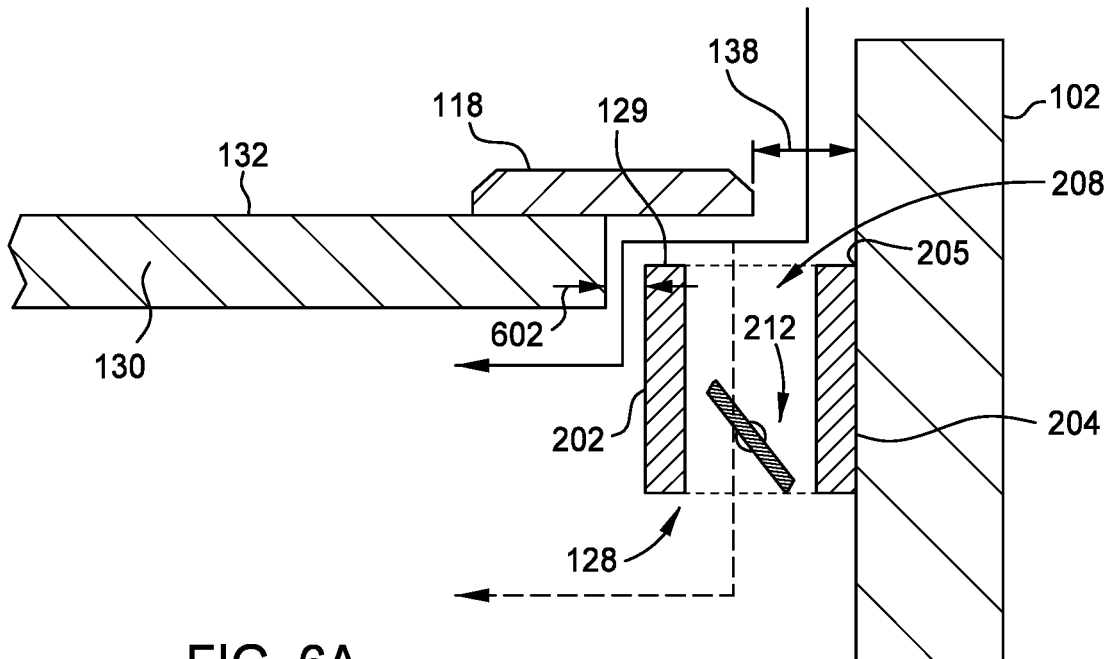
FIG. 6A is a schematic, side-view of a substrate support in a processing position according to embodiments described herein.
Figure 6B:
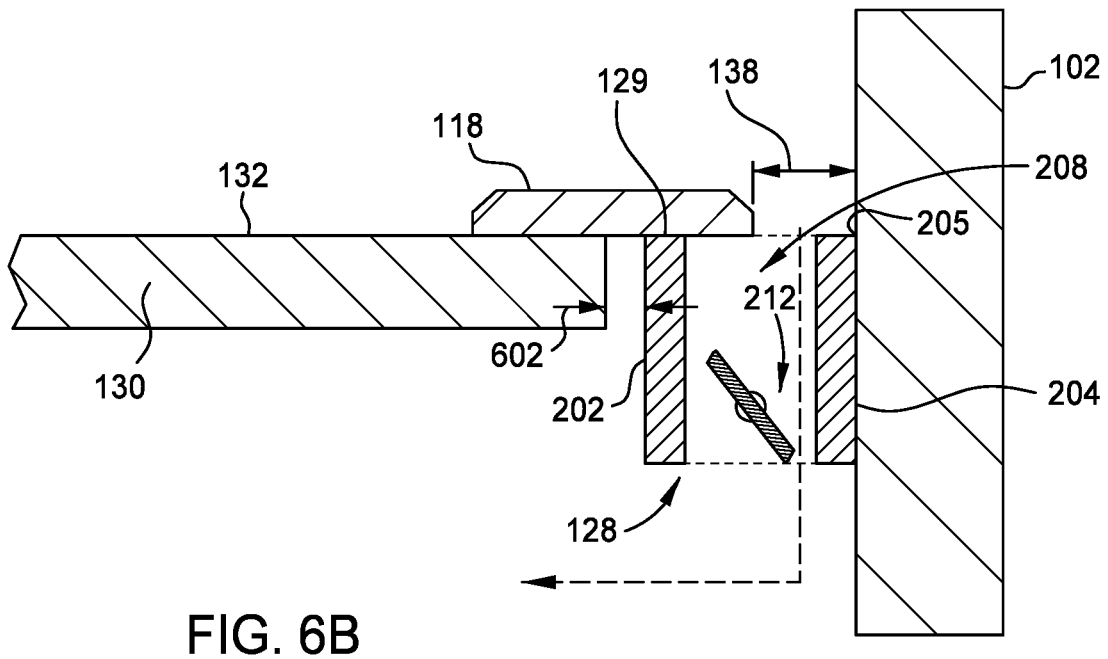
FIG. 6B is a schematic, side-view of a substrate support in a cleaning position according to embodiments described herein.

During the cleaning process, the shadow frame 118 may rest on the shadow frame support 128, and the substrate receiving surface 132 is raised to a level that the substrate receiving surface 132 touches the shadow frame 118 without lifting the shadow frame 118 off of the shadow frame support 128, as shown in FIG. 6B.

In one embodiment, which can be combined with other embodiments described herein, the shadow frame support 128 may comprise the same material as the chamber 100. In another embodiment, which can be combined with other embodiments described herein, the shadow frame support 128 includes, but is not limited to, a dielectric material, a stainless steel material, and an aluminum material. The shadow frame 118 may reduce deposition at the edge of the substrate 140 and on areas of the substrate support 130 that are not covered by the substrate 140. The shadow frame 118 is also operable to protect the substrate support 130 from arcing by protecting the substrate support 130 from being exposed to high density plasma. The shadow frame 118 may also protect exclusion zones along edges of the substrate 140 from being contacted and damaged. The shadow frame 118 prevents deposition on sidewalls of the substrate 140 to avoid intense plasma generation on the sidewalls. Additionally, the temperature uniformity can be maintained as the shadow frame 118 reduces thermal losses from the substrate support 130.

As shown in FIG. 1, the shadow frame 118 includes multiple segments 121 coupled together. The segments 121 are individual sides of the shadow frame 118. For example, the segments 121 are individual sides of a quadrilateral. The shadow frame 118 may include a plurality of pins 146 disposed therein to couple the segments 121 of the shadow frame 118 together. For example, as shown in FIG. 1, the plurality of pins 146 couple adjacent segments 121 of the shadow frame 118 together. A pumping gap 138 is formed between the shadow frame 118 and the walls 102 of the chamber 100 for cleaning gas and/or other processing gases to pass through. As the gas flows through the pumping gap 138, gas flow and pressure control can be achieved by adjusting flow through the pumping gap 138.

In operation, a cleaning gas is remotely ignited into a plasma and the radicals from the plasma are introduced into the chamber via the diffuser 110 to etch away film deposited on surfaces of the substrate support 130, the shadow frame 118, and the walls 102. The vacuum pump 109 draws the radicals towards the bottom of the chamber 100. The radicals reach the substrate support 130 and are directed towards the chamber walls because the radicals cannot pass through the solid substrate support 130. The vacuum pump 109 is disposed in a lower region 144 of the chamber body 103. The lower region 144 is located below the substrate support 130. The vacuum pump 109 draws the radicals through the pumping gap 138 to the lower region 144 below the substrate support 130. The shadow frame support 128 is utilized to direct the cleaning gas towards the corners of the chamber 100 to improve total cleaning time and improve cleaning uniformity. Therefore, the amount of radicals flowing to the corners is greater than the amount of radicals flowing to the sides of the chamber. As the corners take longer to clean, the increase of radicals flowing to the corners decrease total cleaning time.

A controller 150 is in communication with the chamber 100. The controller 150 is in communication flow controllers 212 (shown in FIGS. 2A and 2B) of the shadow frame support 128, the gas manifold 116, and the lift system 136. The controller 150 is operable to facilitate operations of the method 700 described herein. The controller 150 may facilitate the movement of the substrate support 130 as well as the flow of gases into the process volume 106 via the flow controllers 212.

Figure 2A:
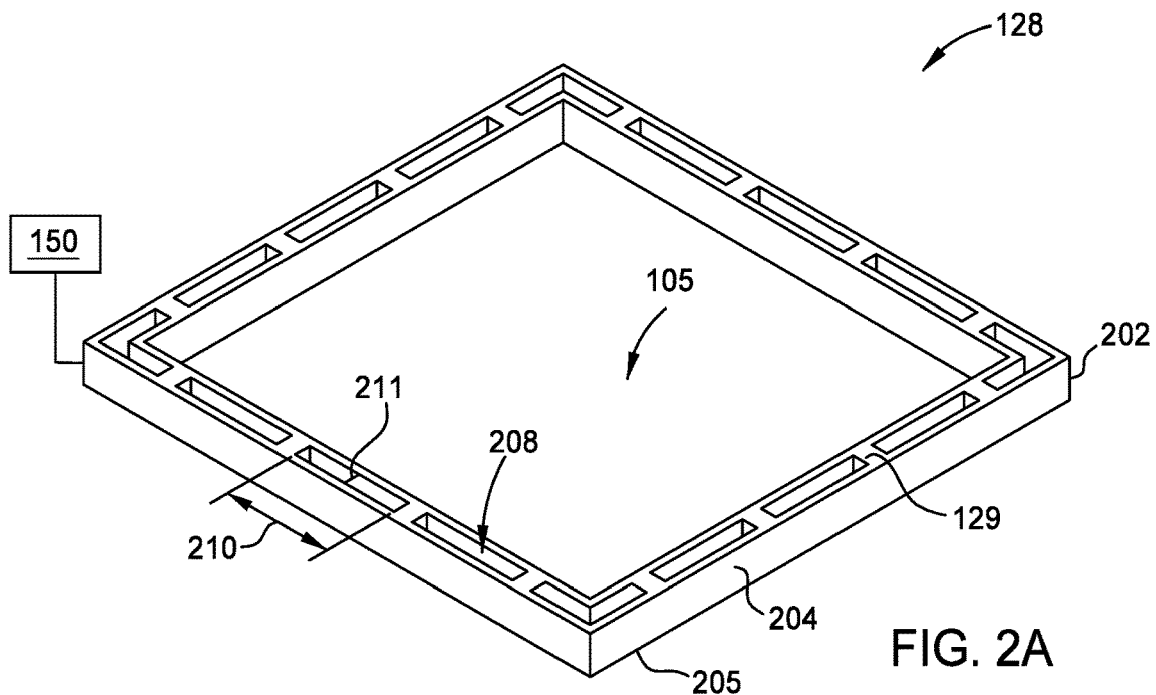
FIG. 2A is a schematic, perspective view of a shadow frame support according to embodiments described herein.
Figure 2B:
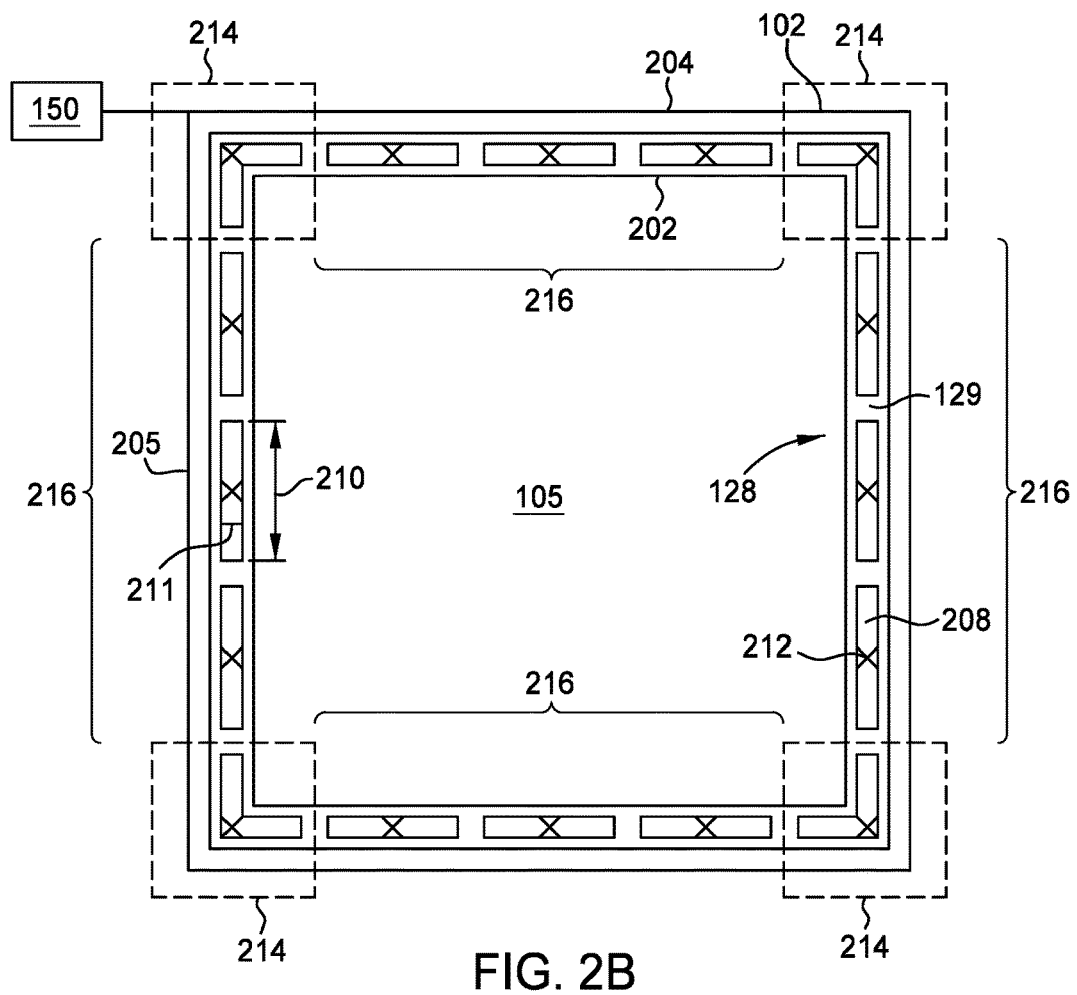
FIG. 2B is a schematic, top view of a shadow frame support according to embodiments described herein.

FIG. 2A is a schematic, perspective view of a shadow frame support 128. FIG. 2B is a schematic, top view of a shadow frame support 128. The shadow frame support 128 is coupled to walls 102 of the chamber 100 as shown in FIG. 1 and FIG. 2B. The shadow frame support 128 is coupled to the walls 102 such that when a substrate support 130 is lowered from a processing position (shown in FIG. 1), the shadow frame 118 is positioned on the shadow frame support 128. The shadow frame support 128 is operable to control the flow of gases i.e., processing gases and cleaning gases. The control of the flow of gases includes controlling the flow of gas from the process volume 106 (shown in FIG. 1) to a lower region 144 (shown in FIG. 1). The shadow frame support 128 is operable to control the flow of a processing gas or a cleaning gas, or both. Although the shadow frame support 128 shown in FIGS. 2A and 2B has a rectangular shape, other shapes of the shadow frame support 128 are contemplated. For example, a circular shaped shadow frame support 128 may be disposed in a circular shaped chamber.

The shadow frame support 128 includes a body 202. As shown in FIG. 2B, an outer surface 204 of the shadow frame support 128 is coupled to walls 102 of the chamber 100. The body 202 is coupled to the walls 102 such that a top surface 129 of the shadow frame support 128 is parallel to a substrate receiving surface 132 (shown in FIG. 1) in the chamber 100. Therefore, an upper surface 119 of the shadow frame 118 (shown in FIG. 1) is parallel to the top surface 129 when resting on the shadow frame support 128. Providing a surface parallel to the substrate receiving surface 132 for the shadow frame 118 to sit on allows for increased durability of the shadow frame 118. For example, the plurality of pins 146 (shown in FIG. 1) disposed within the shadow frame 118 will have an increased lifetime as there will be less stress on the pins 146 due to the top surface 129 of the shadow frame support 128 remaining substantially parallel to the substrate receiving surface 132. The body 202 includes an interior opening 105 disposed through the body 202. The substrate receiving surface 132 shown in FIG. 1 is able to pass through the interior opening 105 to lift the shadow frame 118 into the processing position.

The body 202 has a plurality of channels 208 disposed therethrough. Each channel of the plurality of channels 208 includes a channel length 210. In one embodiment, which can be combined with other embodiments described herein, the channel length 210 is from about 50 mm to about 100 mm. Each channel of the plurality of channels 208 includes a channel width 211. In one embodiment, which can be combined with other embodiments described herein, the channel width 211 is from about 50 mm to about 100 mm. The body 202 may have any number of channels 208 disposed therethrough. For example, each side 205 of the shadow frame support 128 may each have between 3 and 10 channels disposed through the body 202. In one embodiment, which can be combined with other embodiments described herein, the plurality of channels 208 are disposed around an entire perimeter of the body 202, as shown in FIGS. 2A and 2B. In one embodiment, which can be combined with other embodiments described herein, the channel length 210 of each channel 208 is equal. In another embodiment, as shown in FIG. 2B, the channel length 210 of some channels 208 may be longer than other channels 208. In embodiments where the sides 205 of the shadow frame support 128 are longer than other sides 205, such as in FIG. 2B, the channel length 210 on the longer sides 205 may be increased or the number of channels 208 in the longer side 205 may be increased. The plurality of channels 208 are oriented through the body 202 to be parallel with the walls 102 of the chamber 100 and/or parallel with sidewalls of the body 202.

The shadow frame support 128 includes a flow controller 212 disposed in the plurality of channels 208 of the shadow frame support 128. Each flow controller 212 is operable to control the amount of cleaning gas that may flow through each of the plurality of channels 208. Each flow controller is coupled to the body 202. In embodiment, which can be combined with other embodiments described herein, a flow controller 212 is disposed in each channel 208 of the shadow frame support 128. Including the flow controller 212 in each channel 208 allows for the control of flow of cleaning gas through each channel 208. Each flow controller 212 is operable to be adjustable such that the channel 208 will have an open ratio between 0% and 100%. The open ratio defines the amount of gas able to pass therethrough. For example, an open ratio of 100% corresponds to a fully open channel. An open ratio of 0% corresponds to a fully closed channel.

The ability to control the flow of cleaning gas and/or other processing gases through each channel 208 of the shadow frame support 128 allows for the cleaning end point of the cleaning process to be achieved faster. The user is able to control the flow of the gases during the cleaning process in real-time before, during, or after the cleaning process. The flow controller 212 may be adjusted by turning a dialing tool 228 (shown in FIG. 2C). Alternatively, the controller 150 is operable to provide instructions to remotely adjust the flow controller 212 to change the open ratio. The controller 150 is in communication with adjustment actuators 222 (shown in FIG. 2C) of each flow controller 212. Each flow controller 212 is adjusted in real-time during the cleaning process. The controller 150 is operable to adjust each flow controller 212 in each channel 208 independently and simultaneously. As the final cleaning reactions occur in corner regions 214 of the chamber 100, the flow controllers 212 can be adjusted to direct more cleaning gas to the corner regions 214. For example, in the channels 208 disposed in the corner regions 214 of the shadow frame support 128, the flow controllers 212 will have a higher open ratio than the channels 208 disposed in an intermediate region 216 disposed between the corner regions 214.

As each flow controller 212 is individually adjustable, each open ratio in each channel 208 can be refined. For example, as the cleaning time in the intermediate regions 216 is shorter than in the corner regions 214, the flow controllers 212 in the intermediate regions 216 may have an open ratio between about 5% and 30%. The flow controllers 212 in the corner regions 214 may have an open ratio between about 30% and 60%. Therefore, by adjusting the open ratios of the flow controller 212, cleaning uniformity is improved and the amount of cleaning gas needed to the reach the cleaning end point is reduced.

Figure 2C:
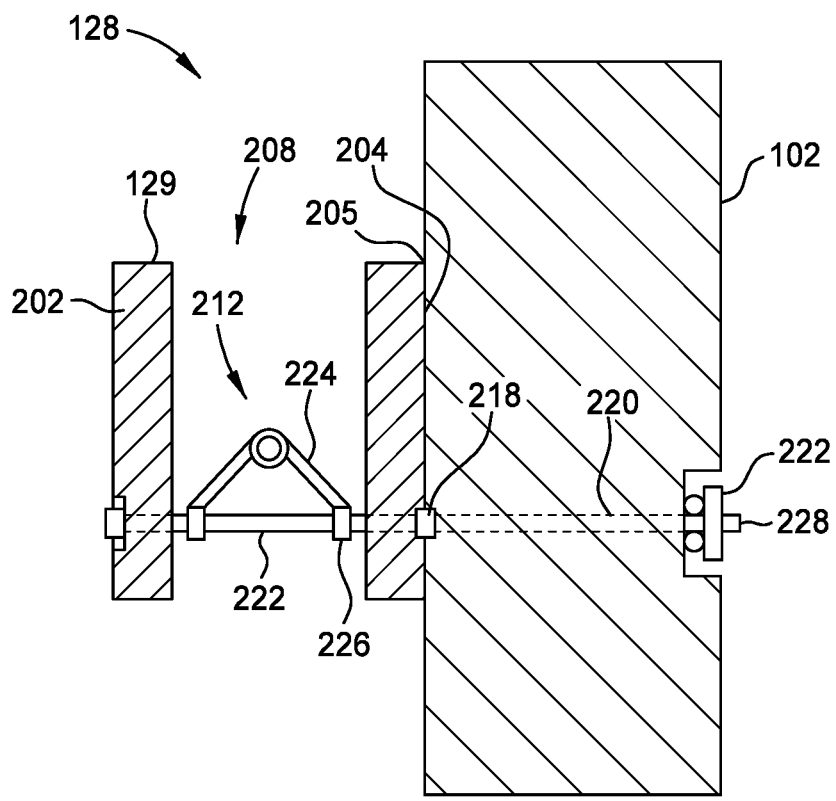
FIG. 2C is a schematic, cross-sectional view of a shadow frame support coupled to a wall of a chamber according to embodiments described herein.

FIG. 2C is a schematic, cross-sectional view of a shadow frame support 128 coupled to a wall 102 of a chamber 100. A flow controller 212 is disposed in the channel 208. The outer surface 204 of the body 202 is coupled to the walls 102 of the chamber 100 via a coupler 218. The coupler 218 may be a threaded bolt in some embodiments.

In one embodiment, which can be combined with other embodiments described herein, a plurality of adjustment openings 220 are disposed through the walls 102 of the chamber 100. Each channel 208 of the shadow frame support 128 may include an adjustment opening 220. An adjustment actuator 222 may be disposed through each adjustment opening 220. The adjustment actuator 222 is coupled to each flow controller 212. The adjustment actuator 222 may be disposed through the coupler 218 such that the flow controller 212 is coupled to the adjustment actuator 222. In some embodiments, which can be combined with other embodiments described herein, the adjustment actuator 222 may be activated with a dialing tool 228, such as a keyed member or threaded shaft, to manually rotate the flow blockers 224, as shown in FIG. 2C. The dialing tool 228 allows for the adjustment actuator 222 to be controlled such that the flow blockers 224 are adjusted. The dialing tool 228 may be positioned in contact with the adjustment actuator 222 such that the adjustment actuator 222 is activated upon rotation of the dialing tool 228.

In one embodiment, which can be combined with other embodiments described herein, the flow controller 212 includes flow blockers 224, e.g. flappers or butterfly valves among other examples, as shown in FIG. 2C. The flow blockers 224 are operable to be adjusted to change the open ratio within the channel 208. In some embodiments, the flow blockers 224 are coupled to sliders 226. The sliders 226 are disposed on the adjustment actuator 222. In operation, when the adjustment actuator 222 is activated (e.g., rotated or shifted), the sliders 226 disposed thereon will move along the adjustment actuator 222. As the flow blockers 224 are coupled to the sliders 226, the flow blockers 224 are moved to change the open ratio within the channel 208. For example, as shown in FIG. 2C, as the sliders 226 move outwards, the open ratio decreases. As the sliders 226 move inwards within each channel 208, the open ratio increases. The flow blockers 224 are coupled to the sliders 226 such that the sliders 226 move along the adjustment actuator 222 for the flow blockers 224 to rotate to adjust the open ratio within the channel 208.

As each channel 208 includes a flow controller 212, the open ratio of each channel 208 of the shadow frame support 128 can be independently controlled. The adjustment opening 220 allows for real-time control of the open ratio without breaking vacuum pressure within the chamber 100. In some embodiments, the controller 150 is in communication with the adjustment actuator 222 of each flow controller 212 and is operable to instruct the adjustment actuator 222 to rotate each flow blocker 224 within each of the plurality of channels to adjust an open ratio of each flow controller 212. The controller 150 is operable to provide instructions to remotely adjust the flow controller 212 to change the open ratio. The controller 150 is operable to adjust each flow controller 212 in real-time. The controller 150 is operable to adjust each flow controller 212 in each channel 208 independently and simultaneously. In other embodiments, each flow controller 212 may be controlled manually to adjust the open ratio. For example, the flow controller 212 may be adjusted with the dialing tool 228.

The real-time adjustment of the open ratio with the adjustment actuator 222 allows for adjustment of the open ratio in each channel 208 to have the necessary cleaning rates through each channel 208 without opening the chamber 100. Therefore, the real-time adjustment improves cleaning gas uniformity within the chamber 100. Additionally, film thickness uniformity is achieved during processing operations due to the ability to control processing gas flow through the shadow frame support 128. For example, the deposition rate of different films is affected by the process gas flow rate. Therefore, if the deposition rate needs to be adjusted, the flow rate may be adjusted by activating the adjustment actuator 222 with the controller 150 or the dialing tool 228.

FIG. 3A and FIG. 3B are schematic, cross-sectional views of a first configuration 300 of a flow controller 212. The flow controller 212 is disposed in a channel 208 of a shadow frame support 128. The flow controller 212 includes a flow blocker 224 (e.g., a rotatable plate) operable to block gas flow through the channel 208. An adjustment actuator 222 is coupled to the flow blocker 224. The actuation of the adjustment actuator 222 will rotate the flow blocker to adjust the open ratio. The flow blocker 224 may rotate about a pivot 302. The pivot 302 is a mechanism operable to rotate about a central axis. FIG. 3A shows the flow blocker 224 with an open ratio of 100%. FIG. 3B shows the flow blocker 224 with an open ratio of 0%. The flow controller 212 may have an open ratio between 0% and 100%.

FIG. 4A and FIG. 4B are schematic, cross-sectional views of a second configuration 400 of a flow controller 212. The second configuration 400 is also shown in FIG. 2C. The flow controller 212 is disposed in a channel 208 of a shadow frame support 128. The flow controller 212 includes a flow blocker 224 operable to block gas flow through the channel 208. An adjustment actuator 222 is coupled to the flow blocker 224. The flow blockers 224 are coupled to sliders 226. The sliders 226 are disposed on the adjustment actuator 222. In operation, when the adjustment actuator 222 is actuated, the sliders 226 disposed thereon will move along the adjustment actuator 222. As the flow blockers 224 are coupled to the sliders 226, the flow blockers 224 are moved to change the open ratio within the channel 208. The flow blocker 224 may rotate about a pivot 402. The pivot 402 is a mechanism operable to rotate about a central axis. FIG. 4A shows the flow blocker 224 with an open ratio of about 10%. FIG. 4B shows the flow blocker 224 with an open ratio of 70%. The flow controller 212 may have an open ratio between 0% and 100%.

Figure 5A:
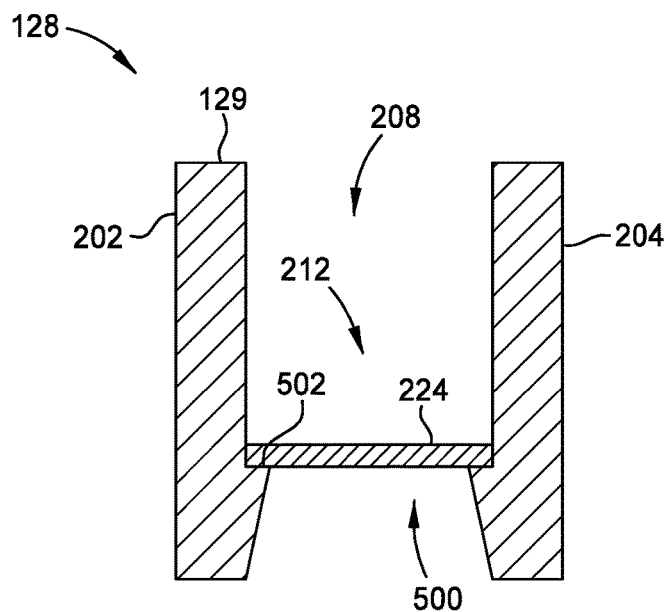
FIG. 5A is a schematic, cross-sectional view of a third configuration of a flow controller according to embodiments described herein.

FIG. 5A is a schematic, cross-sectional view of a third configuration 500 of a flow controller 212. The flow controller 212 is disposed in a channel 208 of a shadow frame support 128. The flow controller 212 includes a flow blocker 224 operable to block gas flow through the channel 208. The flow blocker 224 is configured to sit on a ledge 502 in each of the plurality of channels 208. The ledge 502 is coupled to the shadow frame support 128 within the plurality of channels 208.

Figures 5B, 5C, 5D:
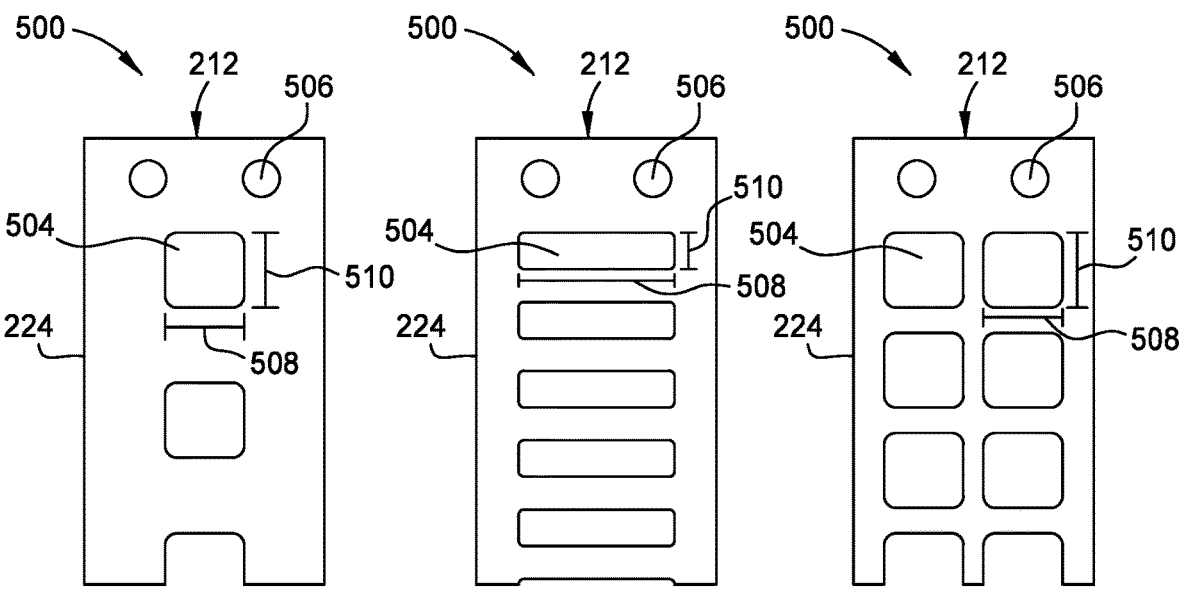
FIGS. 5B-5D show a schematic, top-view of a flow blocker according to embodiments described herein.

FIGS. 5B-5D show a schematic, top-view of a flow blocker 224. Each flow blocker 224 includes one or more apertures 504 disposed therethrough. The apertures 504 are configured to allow gas to flow therethrough. The location and size of the apertures 504 can be adjusted to increase or decrease the open ratio of the flow controller 212. Although the one or more apertures 504 are shown with polygonal shapes, the one or more apertures are not limited in shape. For example, the apertures 504 may have a circular, triangular, or polygonal shape. FIG. 5B shows the flow blocker 224 with an open ratio of 20%. FIG. 5C shows the flow blocker 224 with an open ratio of 40%. FIG. 5D shows the flow blocker 224 with an open ratio of 60%. The flow controller 212 shown in FIGS. 5A-5D may have an open ratio between 0% and 100%. The flow blocker 224 may also include bolt holes 506. The flow blocker 224 may be bolted to the ledge 502 (shown in FIG. 5A) with bolts disposed through the bolt holes 506. The flow blocker 224 utilized in the third configuration 500 of a flow controller 212 includes, but is not limited to, ceramic materials, aluminum alloys, and anodized aluminum alloys. For example, the flow blocker 224 may include an aluminum alloy such as AL6061.

Each of the apertures 504 includes an aperture width 508 and an aperture length 510. The aperture width 508 and the aperture length 510 can be adjusted to change the open ratio of each flow blocker 224. In some embodiments, which can be combined with other embodiments described herein, the apertures 504 may be 10 mm×20 mm, 10 mm×30 mm, and 10 mm×50 mm.

FIG. 6A is a schematic, side-view of a substrate support 130 in a processing position. During substrate processing, the substrate support 130 having a substrate (not shown in the figure) disposed thereon, is raised to a position such that the shadow frame 118 is spaced from the shadow frame support 128. The shadow frame 118 is lifted by the substrate support 130, thus a processing gas may flow through a gap 602 formed between the substrate support 130 and the shadow frame support 128 via a pumping gap 138 between the shadow frame 118 and the walls 102. Therefore, the processing gas is not forced to channels 208 of the shadow frame support 128.

FIG. 6B is a schematic, side-view of a substrate support 130 in a cleaning position. The shadow frame 118 blocks the gap 602 between the substrate support 130 and the shadow frame support 128. During cleaning, the shadow frame 118 is disposed on top of the shadow frame support 128. The substrate support 130 is shown in the cleaning position so that the shadow frame 118 touches both the substrate support 130 and the shadow frame support 128. The shadow frame 118 blocks the gap 602 between the substrate support 130 and the shadow frame support 128, forcing the cleaning gas to the plurality of channels 208 of the shadow frame support 128. In one embodiment, the shadow frame support 128 blocks the cleaning gas from flowing along a length of the walls 102 and directs the cleaning gas flow to the corner regions 214 (shown in FIG. 2B).

Figure 7:
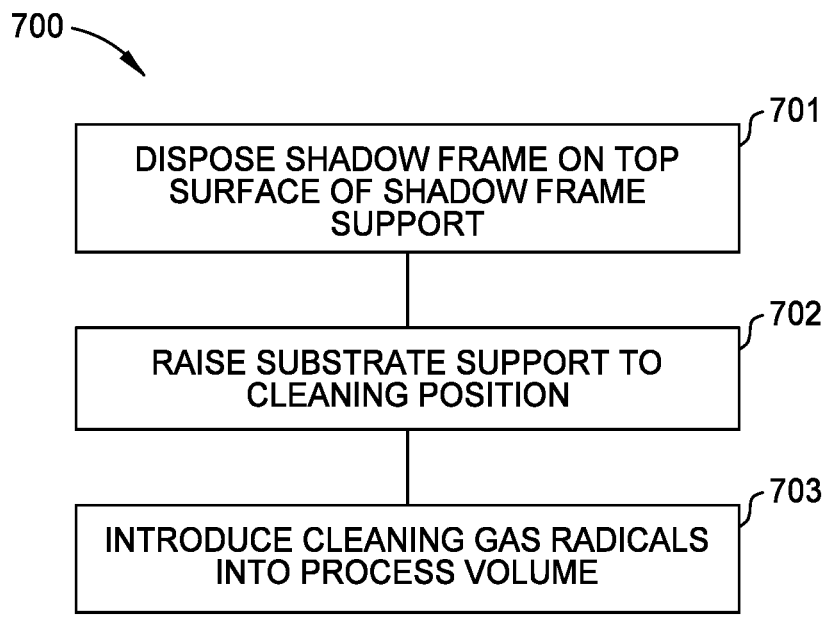
FIG. 7 is a flow diagram of a method for cleaning a chamber according to embodiments described herein.

FIG. 7 is a flow diagram of a method 700 for cleaning a chamber 100. To facilitate explanation, the method 700 will be described with reference to the chamber 100 of FIG. 1. However, it is to be noted that chambers other than the chamber 100 may be utilized in conjunction with the method 700. Each of the first configuration 300, the second configuration 400, or the third configuration 500 of a flow controller 212 may be utilized in conjunction with the method 700. A controller 150 is coupled to the chamber 100. The controller 150 is configured to facilitate operations of the method 700.

At operation 701, a shadow frame 118 is disposed on a top surface 129 of a shadow frame support 128 in a chamber 100. The shadow frame support 128 includes a plurality of channels 208 disposed therethrough. Each channel 208 includes a flow controller 212 configured to facilitate flow of cleaning gas therethrough. At operation 702, the substrate support 130 is raised to a cleaning position (shown in FIG. 6B). The cleaning position is such that the shadow frame 118 is in contact with both the substrate support 130 and the shadow frame support 128.

At operation 703, cleaning gas radicals are introduced into a process volume 106 of the chamber 100. The cleaning gas may include, but is not limited to, $NF_3$, $F_2$, $SF_6$, $C_2F_6$, HCl, or combinations thereof. In one embodiment, a cleaning gas is remotely ignited into a plasma and the radicals from the plasma are introduced into the chamber to etch away film deposited on surfaces of the substrate support 130, the shadow frame 118, and the walls 102 in a process volume 106 of the chamber 100. The vacuum pump 109 draws the radicals towards the bottom of the chamber 100 (e.g., a lower region 144).

The cleaning gas passes through the channels 208 of the shadow frame support 128 as the cleaning gas moves from the process volume 106 to the lower region 144. The flow controller 212 in each of the plurality of channels 208 can be activated to adjust an open ratio in each channel 208. For example, the flow controllers 212 in the channels 208 of corner regions 214 (shown in FIG. 2B) may have an open ratio higher than the flow controllers 212 in intermediate regions 216 (shown in FIG. 2B). As the cleaning time required in the corner regions 214 is higher than the intermediate regions 216, increasing the open ratio in the corner regions 214 improves cleaning uniformity and decreases total cleaning time. When the total cleaning time is reduced, the amount of cleaning gas needed is also reduced. As a result, production cost is also minimized, which leads to lowered substrate processing costs.

Additionally, each flow controller 212 may be controlled manually to adjust the open ratio in each channel 208. For example, the flow controller 212 may be adjusted with a dialing tool 228 coupled to the flow controller 212 to activate the flow controller 212. In other embodiments, the flow controller 212 may be adjusted with a controller 150 coupled to the chamber 100. The controller provides instructions to remotely adjust the flow controller 212 in each channel 208 to change the open ratio. The controller may adjust each flow controller 212 in real-time.

In embodiments utilizing the third configuration 500 of the flow controllers 212, the open ratio in each channel 208 may be adjusted by switching the flow blockers 224 sitting on a ledge 502 within the channels 208. For example, a flow blocker 224 with a higher open ratio can be replaced with a flow blocker 224 having a lower open ratio, or vice versa.

In summation, a shadow frame support with one or more flow controllers and a method of controlling the flow of gases through the shadow frame support is provided herein. The shadow frame support includes a body coupled to walls of a chamber such that a top surface of the shadow frame support is horizontally disposed in the chamber. The body has a plurality of channels disposed therethrough. Each channel includes a flow controller. The flow controller may be adjusted in real-time to change the open ratio of the flow controller. The open ratio of each channel may be adjusted without breaking the vacuum pressure in the chamber. As such, new designs of shadow frame supports are not required, leading to more throughput. During chamber cleaning processes, the cleaning gas may be directed as desired through the plurality of channels. The chamber cleaning time can be minimized by directing cleaning gas to the corners of the process chamber. Additionally, the shadow frame support improves the durability of the shadow frame as an upper surface of the shadow frame and a top surface of the shadow frame support are parallel to each other.

Embodiments and all of the functional operations described in this specification can be implemented in digital electronic circuitry, or in computer software, firmware, or hardware, including the structural means disclosed in this specification and structural equivalents thereof, or in combinations of them. Embodiments described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

What is claimed is:

1. A shadow frame support, comprising:
   a body having corners with an interior opening;
   a plurality of first channels disposed through the corners of the body in corner regions of the body;
   a plurality of second channels disposed through the body in intermediate regions of the body between the corner regions; and
   a flow controller disposed in each of the plurality of first channels and the plurality of second channels,
   wherein the flow controller includes a flow blocker in communication with an adjustment actuator, the adjustment actuator operable to adjust each flow blocker within each of the plurality of first channels and the plurality of second channels to adjust an open ratio of each flow controller.

2. The shadow frame support of claim 1, wherein a controller is in communication with the adjustment actuator of each flow controller.

3. The shadow frame support of claim 2, wherein the controller is operable to instruct the adjustment actuator to rotate each flow blocker within each of the plurality of first channels and the plurality of second channels to adjust the open ratio of each flow controller.

4. The shadow frame support of claim 1, wherein a dialing tool coupled to the adjustment actuator of each flow controller is operable to rotate each flow blocker within each of the plurality of first channels and the plurality of second channels to adjust the open ratio of each flow controller.

5. The shadow frame support of claim 1, wherein the plurality of first channels and the plurality of second channels are disposed around a perimeter of the body of the shadow frame support.

6. A process chamber, comprising:
   a chamber body having an interior defined by a plurality of walls;
   a substrate support disposed in the chamber body;
   a diffuser disposed above the substrate support within the chamber body; and
   a shadow frame support disposed inside the chamber body, the shadow frame support including:
      a body having corners, wherein each outer surface of the body is coupled to an interior surface of the plurality of walls;
      a plurality of first channels disposed through the corners of the body in corner regions of the body;
      a plurality of second channels disposed through the body in intermediate regions of the body between the corner regions; and
      a flow controller disposed in each of the plurality of first channels and the plurality of second channels.

7. The process chamber of claim 6, wherein the flow controller includes a flow blocker, wherein the flow blocker is a plate, the plate including a plurality of apertures therethrough.

8. The process chamber of claim 7, wherein the plate is disposed on a ledge, the ledge coupled to the shadow frame support in each of the plurality of first channels and the plurality of second channels.

9. The process chamber of claim 6, wherein the flow controller includes a flow blocker, wherein a controller in communication with an adjustment actuator of each flow controller is operable to instruct the adjustment actuator to rotate each flow blocker within each of the plurality of first channels and the plurality of second channels to adjust an open ratio of each flow controller.

10. The process chamber of claim 6, wherein a top surface of the shadow frame support is parallel to a substrate receiving surface of the substrate support.

11. The process chamber of claim 6, wherein each intermediate region of the shadow frame support includes between 3 and 10 channels of the plurality of second channels.

12. The process chamber of claim 6, wherein a dialing tool coupled to an adjustment actuator of each flow controller is operable to rotate each flow blocker within each of the plurality of first channels and the plurality of second channels to adjust an open ratio of each flow controller.

\* \* \* \* \*